United States Patent
Misic

(10) Patent No.: US 6,833,705 B2
(45) Date of Patent: Dec. 21, 2004

(54) NEUROVASCULAR COIL SYSTEM AND INTERFACE AND SYSTEM THEREFOR AND METHOD OF OPERATING SAME IN A PLURALITY OF MODES

(75) Inventor: George J. Misic, Allison Park, PA (US)

(73) Assignee: Medrad, Inc., Indianola, PA (US)

(*) Notice: Subject to any disclaimer, the term of this patent is extended or adjusted under 35 U.S.C. 154(b) by 0 days.

(21) Appl. No.: 10/082,818

(22) Filed: Feb. 25, 2002

(65) Prior Publication Data

US 2003/0001573 A1 Jan. 2, 2003

Related U.S. Application Data

(63) Continuation of application No. 09/449,255, filed on Nov. 24, 1999, now Pat. No. 6,356,081.
(60) Provisional application No. 60/109,820, filed on Nov. 25, 1998.

(51) Int. Cl.⁷ ................................................ G01V 3/00
(52) U.S. Cl. ......................................... 324/322; 324/318
(58) Field of Search .............................. 324/322, 318, 324/300, 306, 307, 309, 312, 314

(56) References Cited

U.S. PATENT DOCUMENTS

| | | |
|---|---|---|
| 4,634,980 A | 1/1987 | Misic et al. |
| 4,684,895 A | 8/1987 | Misic |
| 4,692,705 A | 9/1987 | Hayes |
| 4,731,584 A | 3/1988 | Misic et al. |
| 4,740,751 A | 4/1988 | Misic et al. |
| 4,764,726 A | 8/1988 | Misic et al. |
| 4,793,356 A | 12/1988 | Misic et al. |
| 4,797,617 A | 1/1989 | Misic et al. |
| 4,825,162 A | 4/1989 | Roemer et al. |
| 4,839,594 A | 6/1989 | Misic et al. |
| 4,841,248 A | 6/1989 | Mehdizadeh |
| 4,879,516 A | 11/1989 | Mehdizadeh et al. |
| 4,881,034 A | 11/1989 | Kaufman et al. |
| 4,920,318 A | 4/1990 | Misic et al. |
| 4,975,644 A | 12/1990 | Fox |
| 5,136,244 A | 8/1992 | Jones et al. |
| 5,196,796 A | 3/1993 | Misic et al. |
| 5,209,233 A | 5/1993 | Holland et al. |
| 5,256,971 A | 10/1993 | Boskamp |
| 5,258,717 A | 11/1993 | Misic et al. |

(List continued on next page.)

OTHER PUBLICATIONS

Lin, et al., (1998), Magnetic Resonance in Medicine, "A Novel Multi–segment Surface Coil for Neuro–Functional Magnetic Resonance Imaging," vol. 39, pp. 164–168.

Meyer, et al., (1995), Journal of Magnetic Resonance, Series B, "A 3×3 Mesh Two–Dimensional Ladder Network Resonator of MRI of the Human Head," vol. 107, pp. 19–24.

Roemer, et al., (1990), Magnetic Resonance in Medicine, "The NMR Phase Array," vol. 16, pp. 192–225.

*Primary Examiner*—Louis M. Arana
(74) *Attorney, Agent, or Firm*—Gregory L. Bradley; James R. Stevenson

(57) ABSTRACT

A coil interface allows a neurovascular coil system to be coupled to a magnetic resonance (MR) system. The neurovascular coil system has an array of coils including a birdcage coil, a spine coil, and at least one neck coil, with the MR system being equipped with a number of receivers. The coil interface includes a plurality of input ports, a plurality of output ports, and an interface circuit. The plurality of input ports are for coupling to the coils of the neurovascular coil system, and the plurality of output ports for coupling to the receivers of the MR system. The interface circuit enables the input ports and output ports to be selectively interconnected, and thereby enables the neurovascular coil system to be selectively operated in (I) a neurovascular mode; (II) a high resolution brain mode; (III) a high speed brain mode; and (IV) a volume neck mode.

34 Claims, 6 Drawing Sheets

U.S. PATENT DOCUMENTS

| | | |
|---|---|---|
| 5,315,251 A | 5/1994 | Derby |
| 5,348,010 A | 9/1994 | Schnall et al. |
| 5,355,087 A | 10/1994 | Claiborne et al. |
| 5,374,890 A * | 12/1994 | Zou et al. .................. 324/318 |
| 5,517,120 A | 5/1996 | Misic et al. |
| 5,521,506 A | 5/1996 | Misic et al. |
| 5,602,479 A | 2/1997 | Srinivasan et al. |
| 5,610,520 A | 3/1997 | Misic |
| 5,998,999 A | 12/1999 | Richard et al. |
| 6,040,697 A | 3/2000 | Misic |
| 6,051,974 A | 4/2000 | Reisker et al. |
| 6,100,691 A | 8/2000 | Yeung |
| 6,177,797 B1 | 1/2001 | Srinivasan |
| 6,223,065 B1 | 4/2001 | Misic et al. |
| 6,323,648 B1 * | 11/2001 | Belt et al. .................... 324/322 |
| 6,377,044 B1 * | 4/2002 | Burl et al. .................. 324/307 |

\* cited by examiner

I. NVPA (NEUROVASCULAR)

- QUADRATURE/PHASED ARRAY MODE
- CONFIGURATION FILE WILL TURN ON ENTIRE ARRAY
- MAY BE USED FOR ALL TYPE OF BRAIN AND NECK IMAGING, EXCLUDING ECHO PLANAR IMAGING (EPI)
- FOV 46CM (MAXIMUM)

RECOMMENDED USES:
- BRAIN AND OR CERVICAL SPINE LOCALIZERS
- IMAGING OF THE CERVICAL SPINE
- IMAGING OF THE CAROTID ARTERIES
- IMAGING OF THE AORTIC ARCH

2. FASTBRN (FAST BRAIN)

- QUADRATURE MODE
- CONFIGURATION FILE WILL TURN ON ONLY THE HEAD COIL SECTION OF THE ARRAY
- MAY BE USED FOR ECHO PLANAR IMAGING (EPI)
- MAY BE USED FOR VASCULAR STUDIES OF THE BRAIN TO REDUCE RECON TIME
- FOV 24 CM

RECOMMENDED USES:
- EPI SEQUENCES
- IMAGING OF THE BRAIN
- IMAGING OF CIRCLE OF WILLIS

3. HRBRN (HIGH RESOLUTION BRAIN ARRAY)
- QUADRATURE/PHASED ARRAY MODE
- CONFIGURATION FILE WILL TURN ON ONLY THE HEAD COIL SECTION OF THE ARRAY
- USE CONFIGURATION WHEN IMAGING THE BRAIN FOR HIGH RESOLUTION
- COMPATIBLE WITH ALL IMAGING SEQUENCES, EXCEPT EPI
- FOV 24 CM

RECOMMENDED USES:
- HIGH RESOLUTION BRAIN IMAGING
- HIGH RESOLUTION CIRCLE OF WILLIS IMAGING

NEUROVASCULAR COIL SYSTEM AND INTERFACE AND SYSTEM THEREFOR AND METHOD OF OPERATING SAME IN A PLURALITY OF MODES

CROSS-REFERENCE TO RELATED APPLICATIONS

The invention described in this patent application is a continuation of the following patent application: MULTI-MODE OPERATION OF QUADRATURE PHASED ARRAY MR COIL SYSTEMS, U.S. Ser. No. 09/449,255, filed Nov. 24, 1999, now U.S. Pat. No. 6,356,081, which was granted Mar. 12, 2002. The present application, and the above cited parent application on which it is based, claim the benefit of U.S. Provisional Application No. 60/109,820, filed Nov. 25, 1998.

BACKGROUND OF THE INVENTION

The advantages of using phased array or multi-coil magnetic resonance (MR) coil systems to enhance magnetic resonance imaging and spectroscopy are well known. A situation facing the designer of such coils is the finite number of available simultaneous data acquisition channels in the host magnetic resonance imaging (MRI) system. Frequently, there are only four such channels, sometimes known as receivers, available in the host MRI system.

Another issue is the time it takes to reconstruct the images from the collected data. Processing multiple channels to form a single image increases the time needed by the MRI system to process the data, by two or three-dimensional Fourier Transform techniques or other methods, and ultimately to create the final images. Another consideration is that data acquisition hardware with additional performance capabilities may only be available on one receiver, or at least on fewer than the total number of available receivers.

Reconstruction of an image from two quadrature modes of a specific phased array coil element via two separate data acquisition channels provides the best possible image signal-to-noise ratio and uniformity, as the data can always be reconstructed in the most optimum way in such a scenario. However, the use of two separate receivers for the two quadrature signals from a specific phased array coil element may cause problems with reconstruction time, or limitations due to the finite number of available receivers. Thus, there may be conditions when combining the two quadrature signals at the radio frequency (RF) level into a single signal may be most advantageous, and other times when processing the two RF signals independently via two separate data acquisition receivers may be the best scheme.

OBJECTIVES OF THE INVENTION

It is, therefore, an objective of the invention to provide a coil interface that allows the two quadrature magnetic resonance (MR) signals from one or more coil elements of a phased array coil system to be acquired as a single signal (combined at the radio frequency (RF) level within the coil interface) by one receiver channel of the host MRI system or as two separate RF signals by two receivers of the MRI system.

Another objective is to provide a coil interface that allows the mode of operation for the phased array coil to be remotely selected from the operator's console of the host MRI system.

SUMMARY OF THE INVENTION

In a first aspect, the invention provides a coil interface for coupling a neurovascular coil system to a magnetic resonance (MR) system. The neurovascular coil system has an array of coils including a birdcage coil, a spine coil, and at least one neck coil, with the MR system being equipped with a number of receivers. The coil interface includes a plurality of input ports, a plurality of output ports, and an interface circuit. The plurality of input ports are for coupling to the coils of the neurovascular coil system, and the plurality of output ports for coupling to the receivers of the MR system. The interface circuit enables the input ports and output ports to be selectively interconnected, and thereby enables the neurovascular coil system to be selectively operated in (I) a neurovascular mode; (II) a high resolution brain mode; (III) a high speed brain mode; and (IV) a volume neck mode.

In a related aspect, the invention provides a neurovascular coil system for coupling to a magnetic resonance (MR) system, with the MR system being equipped with a number of receivers. The neurovascular coil system includes an array of coils, a plurality of input ports, a plurality of output ports, and an interface circuit. The array of coils includes a birdcage coil, at least one spine coil, and at least one neck coil. The birdcage coil is connected to at least one of the input ports. The at least one spine coil is connected to one of the input ports, and the at least one neck coil is connected to at least one of the input ports. The plurality of output ports are for coupling to the receivers of the MR system. The interface circuit enables the input ports and output ports to be selectively interconnected, and thereby enables the neurovascular coil system to selectively operated in (I) a neurovascular mode; (II) a high resolution brain mode; (III) a high speed brain mode; and (IV) a volume neck mode.

In another related aspect, the invention provides a method of operating a neurovascular coil system with a magnetic resonance (MR) system. The method includes the steps of: providing a plurality of input ports for coupling to the coils of the neurovascular coil system; providing a plurality of output ports for coupling to the receivers of the MR system; and selectively interconnecting the input ports and the output ports, and thereby enable the neurovascular coil system to be selectively operated in (I) a neurovascular mode; (II) a high resolution brain mode; (III) a high speed brain mode; and (IV) a volume neck mode.

In another related aspect, the invention provides a magnetic resonance (MR) system. The MR system includes a number of receivers and a neurovascular coil system, with the neurovascular coil system being operably connectable to other components of the MR system. The neurovascular coil system includes an array of coils, a plurality of input ports, a plurality of output ports, and an interface circuit. The array of coils includes a birdcage coil, at least one spine coil, and at least one neck coil. The birdcage coil is connected to at least one of the input ports. The at least one spine coil is connected to one of the input ports, and the at least one neck coil is connected to at least one of the input ports. The plurality of output ports are for coupling ot the receivers of the MR system. The interface circuit enables the input ports and output ports to be selectively interconnected, and thereby enables the neurovascular coil system to be selectively operated via the MR system in (I) a neurovascular mode; (II) a high resolution brain mode; (III) a high speed brain mode; and (IV) a volume neck mode.

BRIEF DESCRIPTION OF THE DRAWINGS

The preferred embodiments of the present invention are illustrated by way of example, and not limitation, in the figures of the accompanying drawings, in which.

DETAILED DESCRIPTION OF THE PRESENTLY PREFERRED EMBODIMENTS OF THE INVENTION

The presently preferred embodiments of the invention will now be described with reference to the Figures, in which like elements are referred to by like numerals. A number of specific applications of a preferred embodiment are discussed. In particular, the multimode operation of a neurovascular coil designed for and operating on the General Electric Medical Systems Signa MRI system is described; however, the preferred embodiments may be applied to other coils and other systems by those skilled in the art after reviewing this detailed description.

Figure 1:
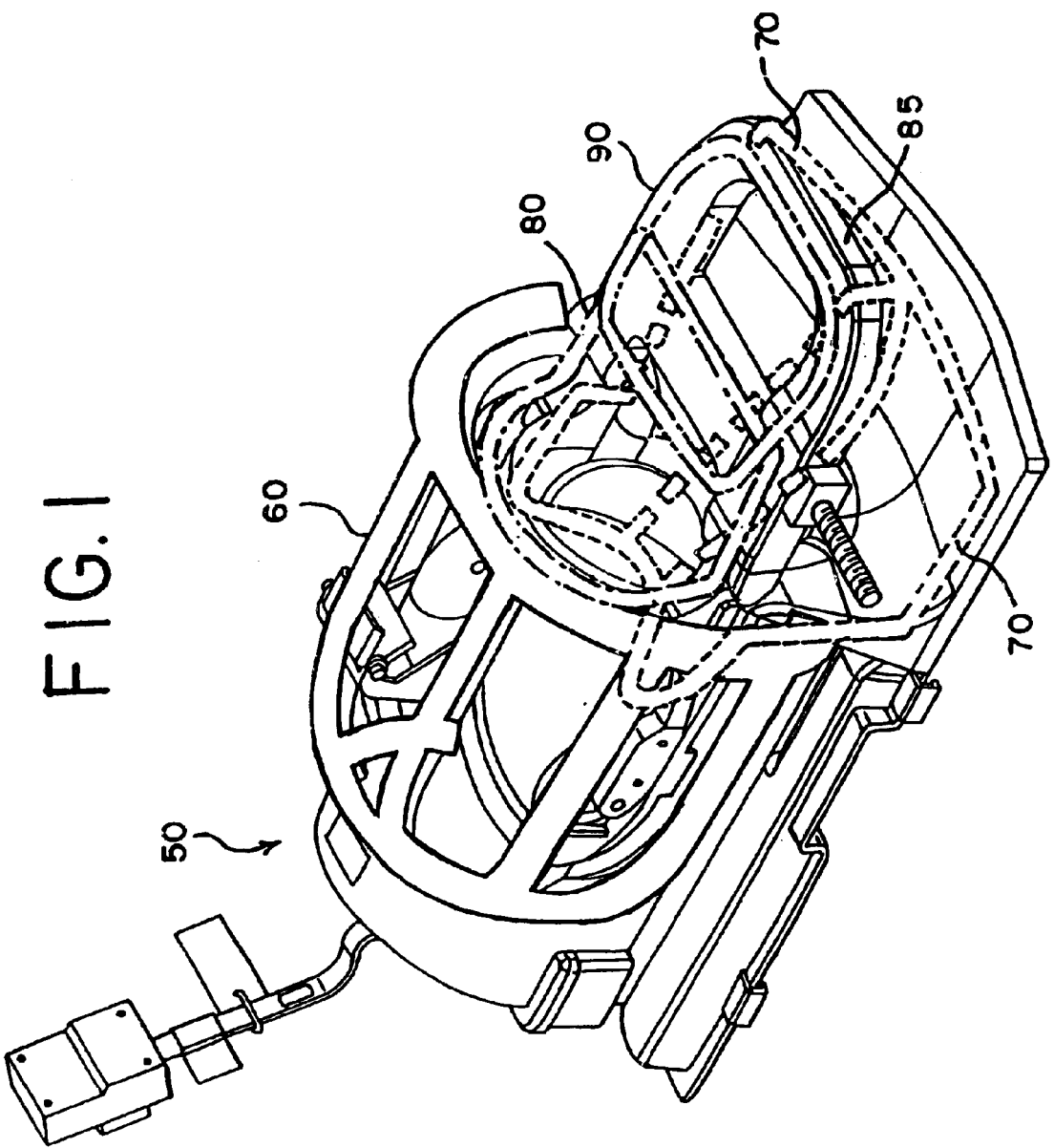
FIG. 1 is a wire model of a phased array neurovascular coil.

FIG. 1 is wire model of a phased array neurovascular coil 50, also referred to herein as a neurovascular array coil, The neurovascular array coil 50 contains four separate imaging coils. The first coil is a quadrature tapered birdcage 60 covering the brain and head. Further details regarding the quadrature tapered birdcage are provided in U.S. application Ser. No. 09/449,256, filed Nov. 24, 1999, now issued as U.S. Pat. No. 6,344,745, the contents of which are incorporated herein by reference. The first coil may alternatively be in the form of a domed birdcage, such as is described in U.S. Pat. No. 5,602,479, the contents of which are incorporated herein by reference, although the tapered birdcage is preferred because it provides improved field homogeneity on the XZ and YZ image planes.

The second coil is formed from two posterior cervical spine coils 70, the outputs of which are preferably combined at the RF level. The third and fourth coils are a superior anterior neck coil 80 and an inferior anterior neck coil 90. In accordance with an alternative embodiment, the outputs of the two posterior cervical spine coils 70 are not combined at the RF level and a single anterior neck coil (not shown) replaces the neck coils 80 and 90.

In accordance with a preferred embodiment, the superior anterior neck coil 80 and the inferior anterior neck coil 90 are mounted in an adjustable manner. For example, referring to FIG. 1, the neck coils 80 and 90 may be housed in a support structure 85, as is known to those skilled in the art. In a preferred embodiment, the support structure 85 is mounted in a hinged manner, with the hinge location being toward the superior end of the support structure 85. When mounted in this manner, the inferior end of the support structure 85 may be raised and/or lowered, depending upon the size of the test subject, and may rest on the chest area of the test subject. This provides the advantage of locating the neck coils 80 and 90 as close to the test subject as possible, thereby improving image quality over embodiments in which the neck coils 80 and 90 are fixedly located.

Figure 2A:
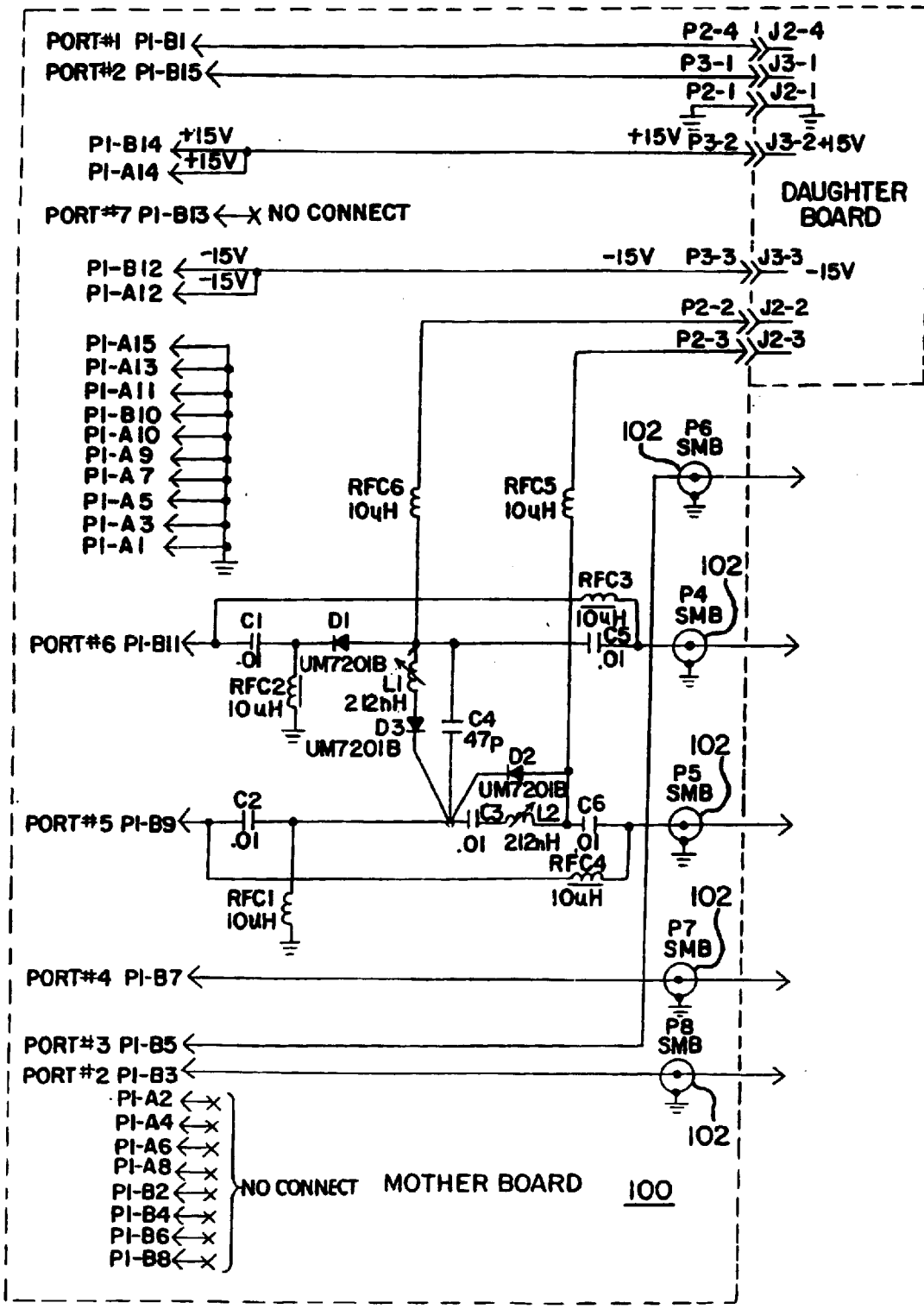
FIGS. 2A and 2B are electrical schematics of a coil interface circuit that provides multimode operation of the phased array neurovascular coil shown in FIG. 1.
Figure 2B:
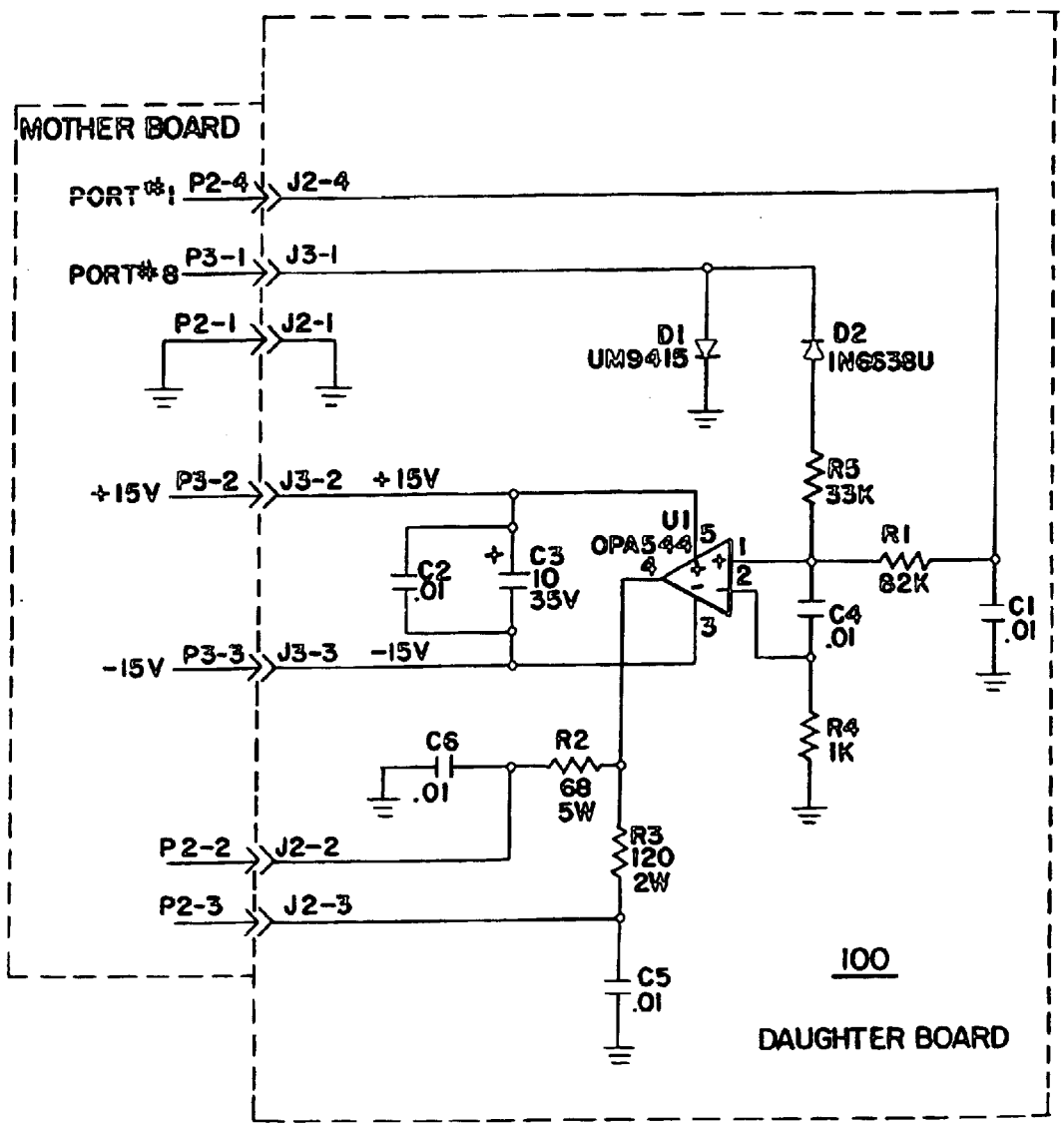

FIGS. 2A and 2B are electrical schematics of a coil interface circuit 100 that provides multimode operation of the phased array neurovascular coil 50 shown in FIG. 1. The coil interface circuit 100 couples the phased array neurovascular coil 50 to a magnetic resonance imaging (MRI) system. The coil interface circuit 100 has a number of signal input ports 102, which are coupled to receive magnetic resonance (MR) signals from the phased array neurovascular coil 50. As shown in FIG. 2A, signal inputs 102 are coupled to output ports (e.g., port #2, port #3, port #4, port #5, and port #6), which are in turn coupled to predetermined MRI system receivers. Many systems, including the GEMS Signa® MRI system, provide only four receiver channels. Thus, because not all the signal inputs 102 can be simultaneously applied to the MRI system when the number of potential signal inputs 102 exceeds the number of available receivers, the interface circuit 100 allows selected signal inputs 102 to be coupled to the MRI system receivers.

Selection of the operational modes of the phased array neurovascular coil 50 is made in the coil interface unit 100 by the use of PIN diode RF switches, as further described below. The following table defines the relationship between signal inputs 102 to the coil interface 100 and outputs, e.g., port #2–6, from the coil interface 100.

| SIGNAL | SMB | SYSTEM PORT | SYSTEM RECEIVER |
| --- | --- | --- | --- |
| Head I | P5 | 5 | 0 |
| Head Q (high res) | P4 | 6 | 1 |
| Head Q (high speed) | P4 | 5 | 0 |
| C-Spine | P7 | 4 | 3 |
| ANT SUP | P6 | 3 | 2 |
| ANT INF | P8 | 2 | 1 |

In the table above, Head I refers to the in-phase MR signal from the birdcage coil 60, Head Q refers to the quadrature MR signal from the birdcage coil 60, C-Spine refers to the combined MR signals from the posterior cervical spine coils 70, ANT SUP refers to the MR signal from the superior anterior neck coil 80, and ANT INF refers to the MR signal from the inferior anterior neck coil 90.

As shown in FIG. 2A, the coil interface 100 is coupled to DC power supplies, +15V and −15V, from the MRI system. The electrical schematic of FIG. 2A also includes a number of inductors, each labeled as "RFC," that function as RF chokes. The RF chokes are preferably self-resonant at approximately 63.87 MHz. For example, the RF chokes may be obtained from J. W. Miller, part no. RFC-50.

The birdcage coil 60 and the coil interface 100 are designed so that the two quadrature signal components from this coil element may selectively be combined into a single signal for simultaneous use with the other three coil elements. This provides coverage of the entire volume within the quadrature neurovascular array 50 using a total of four simultaneous data acquisition channels [receivers] from the MRI system. In addition, by combining the two quadrature signal components, a preferred embodiment allows for applications employing a single FAST receiver, where only one of the available phased array receivers has the FAST data acquisition capability.

When the brain or the brain, brain stem, and cervical region of the spinal cord, for example, are to be imaged with the highest possible image signal to noise ratio and uniformity, another mode may be used. Specifically, the coil interface 100 directs the two quadrature components of the MR signal from the tapered birdcage coil element 60 into two separate receivers for optimum results. An advantage of this feature is that it apreserves the ability to simultaneously cover the entire region from the aortic arch to the top of the head in one phased array acquisition, enables the use of one high performance receiver channel for complete acquisition of images from the brain, and yet enables the highest degrees of resolution, signal to noise ratio, and uniformity to be obtained from the brain, and associated neurological areas of interest by acquiring the data from the two quadrature modes of the tapered birdcage coil element through two separate receivers.

The coil interface 100 supports distinct imaging functions by automatic selection of the optimum assembly of the array coil elements. As described below, the coil interface 100 may be remotely configured, i.e., the state of one or more PIN diode RF switches may be set, based upon inputs from the MRI system console. Examples of distinct imaging modes that may be supported by a coil interface, such as the coil interface shown in FIGS. 2A and 2B, include: NEUROVASCULAR, HIGH RESOLUTION BRAIN, HIGH SPEED BRAIN, HIGH RESOLUTION BRAIN AND CERVICAL SPINE, CERVICAL SPINE, and VOLUME NECK.

Each of these modes is preferably activated by selecting the appropriate Coil Name from the coil selections on the console of the host MRI system when prescribing the scan. By way of the coil interface 100, the needed coils and the signal combining method are activated for the selected mode, and the unused coil elements are electronically disabled to optimize image quality and minimize artifacts. Each mode has a distinct method of operation as described below.

NEUROVASCULAR Mode

In NEUROVASCULAR mode, all of the coil elements in the phased array neurovascular coil 50 are active, and the birdcage coil 60 operates in quadrature with the two signals combined to drive a single receiver. Specifically, the coil interface 100 includes a combiner circuit, including a switch and a phase shifter, that is set to combine the in-phase, or "I," output and the quadrature, or "Q," output of the birdcage coil 60 before applying the signal to the MRI system preamplifier at port #5. The two posterior spine coils 70 drive a single receiver, such as port #4. The superior anterior neck coil 80 and the inferior anterior neck coil 90 each drive a separate receiver, such as ports #3 and #2, respectively. Thus, in NEUROVASCULAR mode, the coil interface 100 provides a total of four simultaneous data acquisitions, the maximum number of simultaneous data acquisitions that can be handled by the MRI system. Since the coverage volume is large, the signal to noise ratio performance of the head portion of the coverage may be slightly reduced, by the combination of the I and Q outputs of the birdcage coil 60, to allow only one receiver channel to be used to cover the head region.

Figure 3:
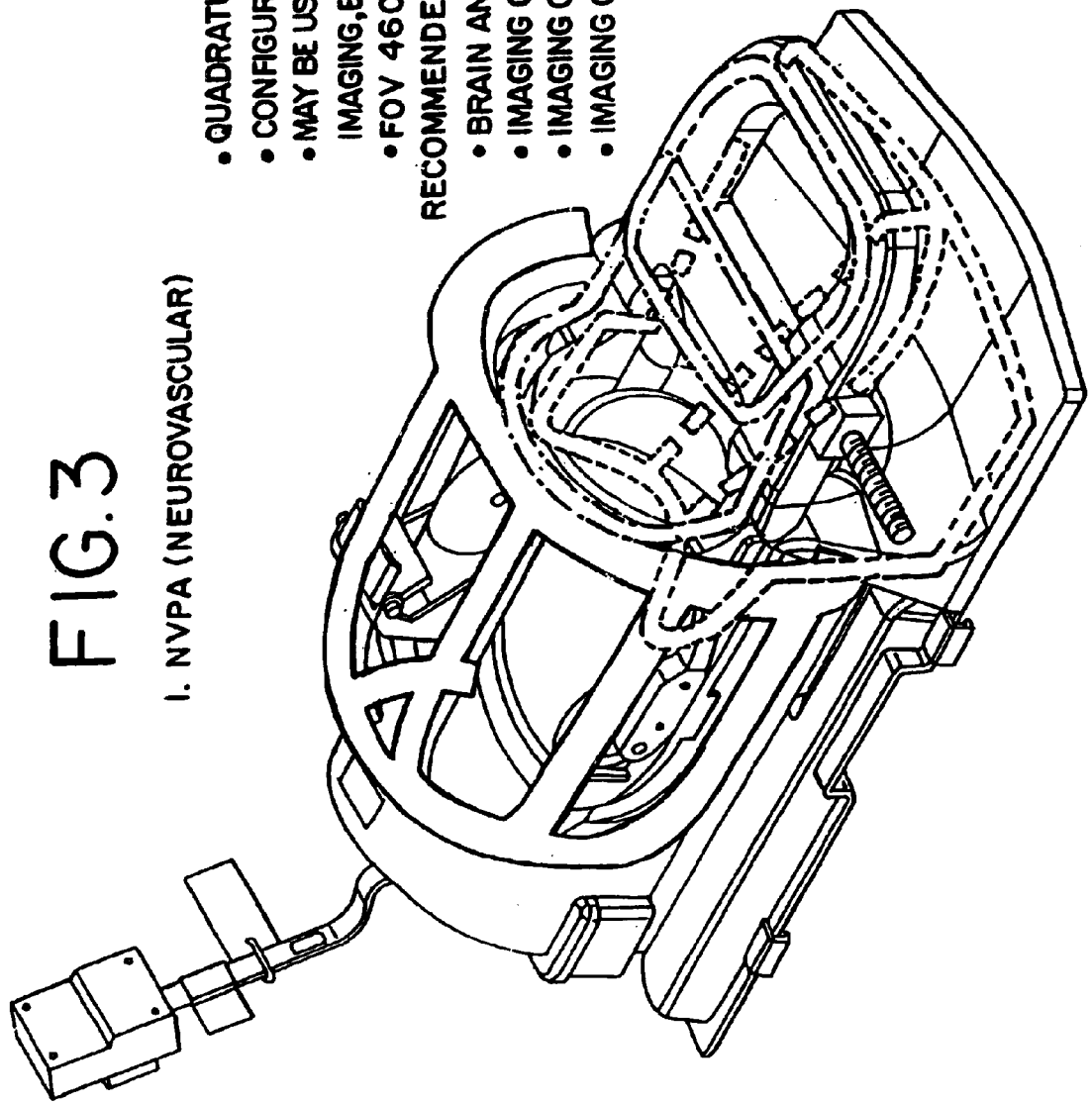
FIG. 3 is a wire model of the phased array neurovascular coil in a first operational mode.

FIG. 3 is a wire model of the phased array neurovascular coil 50 in NEUROVASCULAR mode. As noted above and shown in FIG. 3, all elements of the phased array neurovascular coil 50 are activated and the MRI system operates in the phased array mode. The NEUROVASCULAR mode may essentially be used for all types of brain and neck imaging. The NEUROVASCULAR mode is particularly useful for brain and/or cervical spine localizers, imaging of the cervical spine, imaging of the carotid arteries, and imaging of the aortic arch. As shown in FIG. 3, this mode of operation advantageously provides a field of view of up to 46 cm.

HIGH RESOLUTION BRAIN Mode

In HIGH RESOLUTION BRAIN mode, the two quadrature components of the MR signal from the birdcage coil 60 each drive a separate receiver channel on the MRI system, providing optimum uniformity and signal to noise ratio performance. Specifically, the coil interface 100 couples the I and Q signals from the birdcage coil 60 to separate receiver ports on the MRI system, such as ports 5 and 6, as shown in FIG. 2A and the table above. The combiner circuit in the coil interface 100 is electrically disconnected to allow independent reconstruction of the data from the two channels. The posterior cervical spine coils 70 and the anterior neck coils 80 and 90 are electrically disabled to minimize artifacts and undesirable coil interactions. Since the highest possible degree of signal to noise ratio and uniformity are desired, but coverage of the entire volume of the coil is not needed, two separate receivers are used for the birdcage coil 60 MR signal. Techniques for electrically disabling an imaging coil are well known to those skilled in the art.

Figure 4:
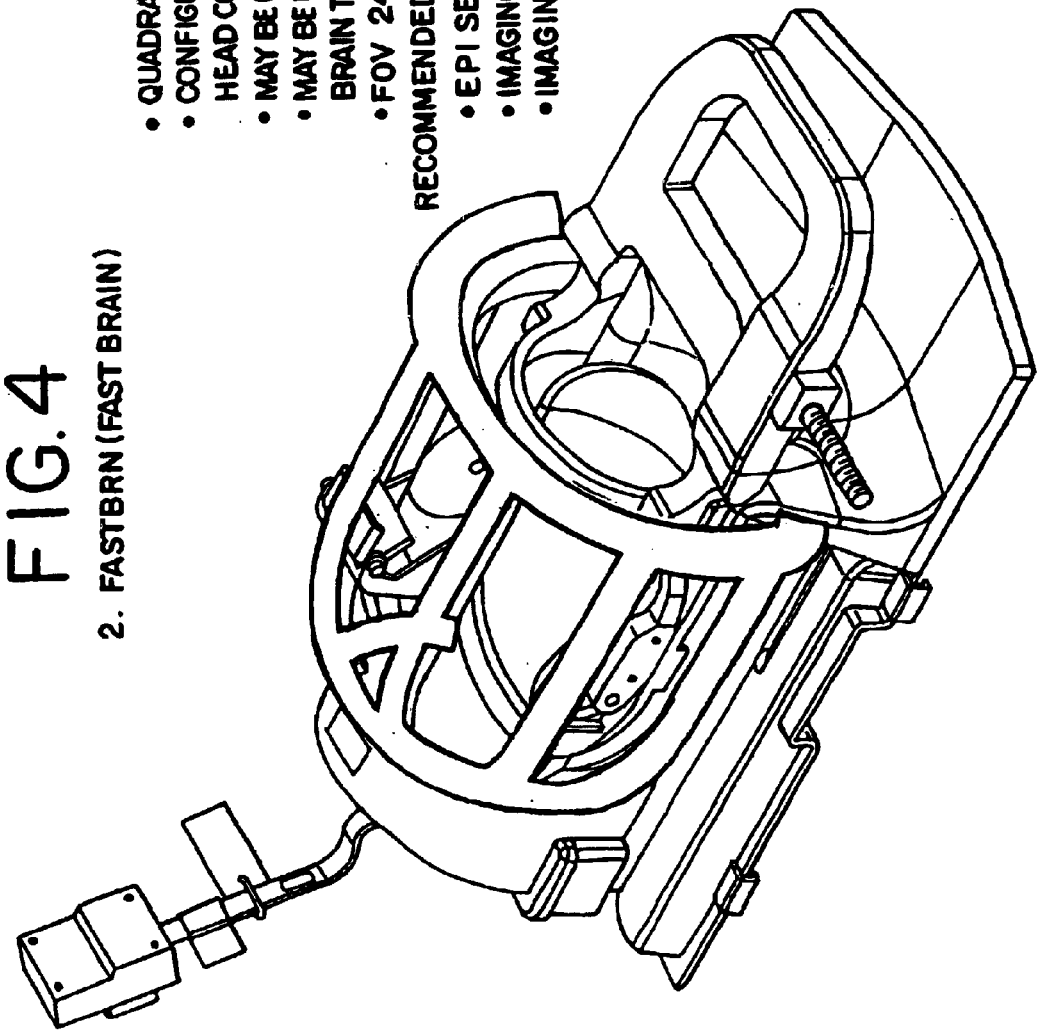
FIG. 4 is a wire model of the phased array neurovascular coil in a second operational mode.

FIG. 4 is a wire model of the phased array neurovascular coil in HIGH RESOLUTION BRAIN imaging mode. As shown in FIG. 4, only the quadrature birdcage coil 60 is activated; the cervical spine coils 70 and the anterior neck coils 80 and 90 are electrically disabled. The MRI system operates in phased array mode. The HIGH RESOLUTION BRAIN imaging mode may essentially be used for all types of brain and/or head imaging but is especially useful for high resolution studies of the brain. The HIGH RESOLUTION BRAIN imaging mode is also useful for high resolution Circle of Willis imaging. As shown in FIG. 4, this mode of operation provides a field of view of up to 24 cm.

HIGH SPEED BRAIN Mode

The HIGH SPEED BRAIN mode routes the two quadrature modes of the head birdcage resonator 60 through the combiner circuit in the coil interface 100 to produce one signal containing the signal from both quadrature modes. In FIG. 2A, the combined signal is provided to the MRI system at port #5. The combined signal drives one channel of the phased array system [preferably Receiver 0 (Receiver selection 1 on LX systems) for the GEMS Signa system] to minimize reconstruction time or to allow the use of a single FAST receiver. All other coil elements are electrically disabled.

Figure 5:
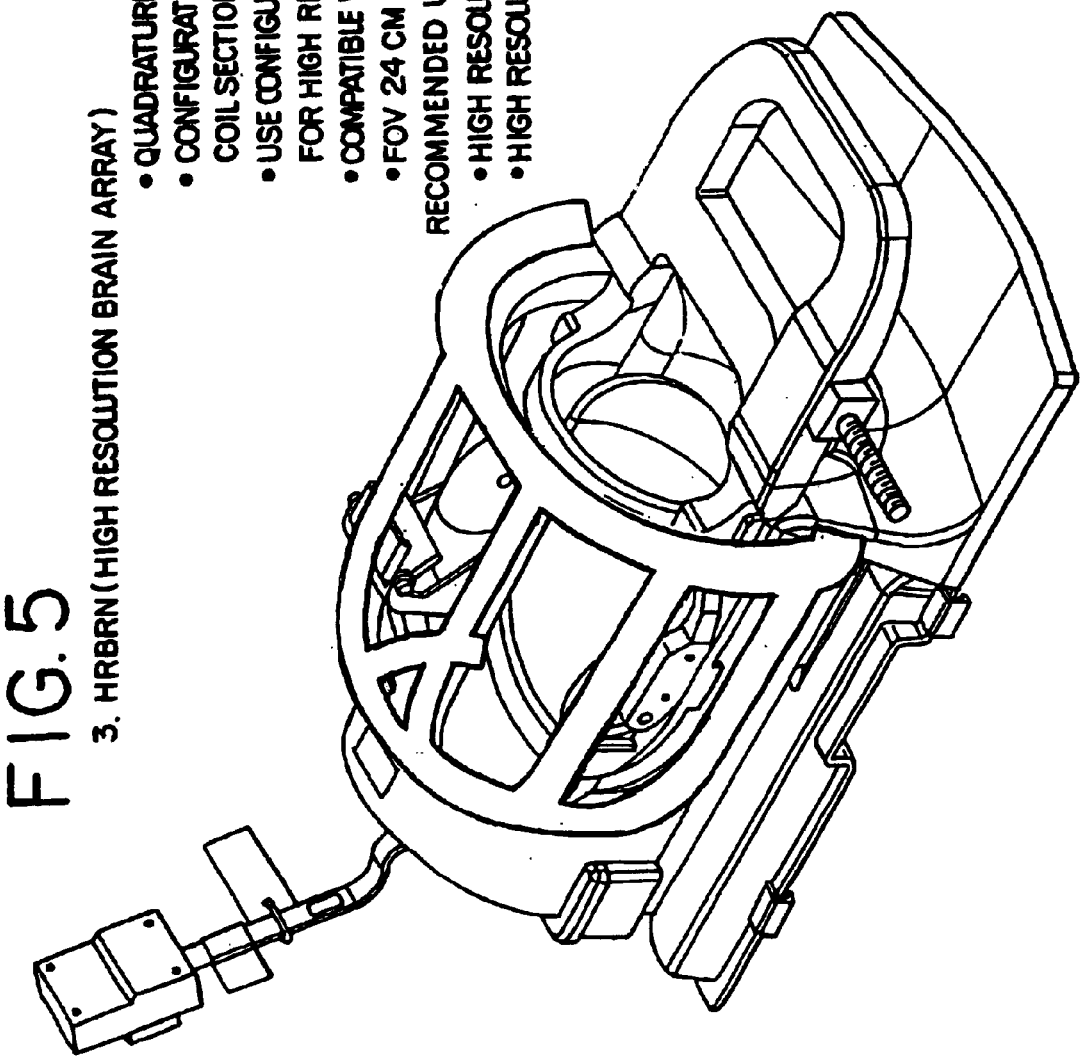
FIG. 5 is a wire model of the phased array neurovascular coil in a third operational mode.

FIG. 5 is a wire model of the phased array neurovascular coil 50 in HIGH SPEED BRAIN mode. Like FIG. 4, only the quadrature birdcage coil 60 is activated; the cervical spine coils 70 and the anterior neck coils 80 and 90 are electrically disabled. The HIGH SPEED BRAIN mode may be used for Echo Planar Imaging and/or vascular or other studies of the brain where decreased acquisition time is desirable. HIGH SPEED BRAIN mode is also useful for imaging the Circle of Willis.

Additional modes of operation for the phased array neurovascular coil 50 can be realized by providing the MRI system with the appropriate port masks for the coil interface 100. For example, the phased array neurovascular coil 50 may also acquire images when operated in one or more of the following modes: HIGH RESOLUTION BRAIN AND CERVICAL SPINE, CERVICAL SPINE and VOLUME NECK. Each of these modes is described in further detail below. For these alternative modes of operation, unless otherwise noted, the design of coil interface 100 shall allow the cervical spine coils 70 to be applied separately to the coil interface, rather than being combined at the RF level.

HIGH RESOLUTION BRAIN AND CERVICAL SPINE Mode

This mode activates the head and posterior cervical spine coils 60 and 70, and disables the anterior neck coils 80 and 90. This allows focal studies of the brain, brain stem, spinal cord, and cervical spine. The two quadrature components of the MR signal from the birdcage coil 60 each drive a separate receiver channel for optimum uniformity and signal to noise ratio performance. The combiner circuit for birdcage coil 60 is electrically disconnected to allow independent reconstruction of the data from the two channels.

Similarly, the two posterior cervical spine coils 70 also each drive a separate receiver channel.

CERVICAL SPINE Mode

In CERVICAL SPINE mode, the two quadrature components of the MR signal from each of the two posterior cervical spine coil elements 70 each drive a separate receiver channel for optimum uniformity and signal to noise ratio performance. The head coil element 60 and the anterior neck coils 80 and 90 are electrically disabled to minimize artifacts and undesirable coil interactions.

VOLUME NECK Mode

This mode disables the tapered birdcage coil 60 covering the head region, and activates the spine region coils to form a volume acquisition of the neck region. The two quadrature components of the MR signal from each of the two posterior cervical spine coil elements 70 and the anterior neck coils 80 and 90 each drive a separate receiver channel for optimum uniformity and signal to noise ratio performance. Alternatively, the MR signals from the two posterior cervical spine coils 70 are combined at the RF level and applied as a single input to the coil interface 100, along with the two MR signals from the anterior neck coils 80 and 90.

As noted above, selection of the modes is made in the coil interface 100 by the use of PIN diode RF switches; the switches either direct the two quadrature signals from the two modes of the birdcage coil element 60 to two separate MR receivers, or combine them with a relative phase difference of 90° and direct them to a single receiver. Determination of which mode to support is made via detection of the bias pattern of the ports in the host GEMS Signa MRI system. As will be apparent to those skilled in the art, the electrical length of the path of the various MR signals through the coil interface 100 should be compensated to ensure that the MR signals may be properly combined by the MRI system. For example, the electrical lengths of the paths through the coil interface 100 may be adjusted to be an integer multiple of half wavelengths.

In view of the wide variety of embodiments to which the principles of the present invention can be applied, it should be understood that the illustrated embodiments are exemplary only, and should not be taken as limiting the scope of the present invention. For example, the steps of the design method may be taken in sequences other than those described, and more or fewer elements may be used than are described. In addition, although reference is made herein to the GEMS Signa MRI system, other systems having similar capabilities may alternatively be used to receive and process signals from the coils described above.

I claim:

1. A coil interface for coupling a neurovascular coil system to a magnetic resonance (MR) system; said neurovascular coil system having an array of coils including a birdcage coil, a spine coil, and at least one neck coil; said MR system being equipped with a predetermined number of receivers; said coil interface comprising:

(a) a plurality of input ports for coupling to said coils of said neurovascular coil system;

(b) a plurality of output ports for coupling to said predetermined number of receivers of said MR system; and (c) an interface circuit for enabling said input ports and said output ports to be selectively interconnected and thereby enable said neurovascular coil system to be selectively operated in (I) a neurovascular mode; (II) a high resolution brain mode; (III) a high speed brain mode; and (IV) a volume neck mode.

2. The coil interface of claim 1 wherein said plurality of input ports includes:

(a) a first input port for receiving an in-phase signal from said birdcage coil;

(b) a second input port for receiving a quadrature signal from said birdcage coil;

(c) a third input port for receiving a spine signal from said spine coil;

(d) a fourth input port for receiving a first neck signal from a first of said at least one neck coil; and (e) a fifth input port for receiving a second neck signal from a second of said at least one neck coil; wherein in said neurovascular mode said interface circuit interconnects (i) said first and said second input ports to a first of said output ports; (ii) said third input port to a second of said output ports; (iii) said fourth input port to a third of said output ports; and (iv) said fifth input port to a fourth of said output ports.

3. The coil interface of claim 2 wherein said in-phase and said quadrature signals received by said first and said second input ports, respectively, are phase shifted relative to one another before being combined and applied to said first output port.

4. The coil interface of claim 1 wherein said plurality of input ports includes:

(a) a first input port for receiving an in-phase signal from said birdcage coil; and (b) a second input port for receiving a quadrature signal from said birdcage coil;

wherein in said high resolution brain mode said interface circuit interconnects (i) said first input port to one of said output ports and (ii) said second input port to an other of said output ports, thereby allowing said in-phase signal to be applied to said one output port and said quadrature signal to be applied to said other output port.

5. The coil interface of claim 1 wherein said plurality of input ports includes:

(a) a first input port for receiving an in-phase signal from said birdcage coil; and (b) a second input port for receiving a quadrature signal from said birdcage coil;

wherein in said high speed brain mode said interface circuit interconnects said first and said second input ports to a first of said output ports with said in-phase and said quadrature signals received by said first and said second input ports, respectively, being phase shifted relative to one another before being combined and applied to said first output port.

6. The coil interface of claim 1 wherein said plurality of input ports includes:

(a) a first input port for receiving a spine signal from said spine coil;

(b) a second input port for receiving a first neck signal from said at least one neck coil; and (c) a third input port for receiving a second neck signal from said at least one neck coil;

wherein in said volume neck mode said interface circuit interconnects (i) said first input port to a first of said output ports thereby allowing said spine signal to be applied to said first output port, (ii) said second input port to a second of said output ports thereby allowing said first neck signal to be applied to said second output port, and (iii) said third input port to a third of said output ports thereby allowing said second neck signal to be applied to said third output port.

7. The coil interface of claim 1 wherein said plurality of input ports includes:
   (a) a first input port for receiving a spine signal from said spine coil; and
   (b) a second input port for receiving a neck signal from said at least one neck coil;
   wherein in said volume neck mode said interface circuit interconnects (i) said first input port to a first of said output ports thereby allowing said spine signal to be applied to said first output port, and (ii) said second input port to a second of said output ports thereby allowing said neck signal to be applied to said second output port.

8. The coil interface of claim 1 wherein said plurality of input ports includes:
   (a) a first input port for receiving an in-phase signal from said birdcage coil; and
   (b) a second input port for receiving a quadrature signal from said birdcage coil;
   wherein said interface circuit is switchable between interconnecting (i) said first and said second input ports to one of said output ports with said in-phase and said quadrature signals being phase shifted relative to one another, combined and applied to said one of said output ports; and (ii) said first and said second input ports, and applying said in-phase and said quadrature signals received respectively thereby, to a first and a second of said output ports, respectively.

9. The coil interface of claim 1 wherein a conductive path through said interface circuit between any one of said of input ports and any one of said output ports has an electrical length that is approximately equal to an integer multiple of half wavelengths.

10. The coil interface of claim 1 wherein said interface circuit allows said neurovascular coil system to be switched remotely between said modes of operation.

11. The coil interface of claim 10 wherein said interface circuit includes a combiner circuit for at least one of said coils for remotely switching said neurovascular coil system between said modes of operation, said combiner circuit comprising at least one remotely operable PIN diode and a 90 degree phase shifting circuit.

12. The coil interface of claim 10 wherein said interface circuit includes at least one PIN diode operable from a console of said MR system for switching said neurovascular coil system between said modes of operation.

13. The coil interface of claim 12 wherein said MR system determines which of said modes of operation of said neurovascular coil system to support by detecting via said receivers of said MR system a bias pattern of said at least one PIN diode.

14. A method of operating a neurovascular coil system with a magnetic resonance (MR) system; said neurovascular coil system having an array of coils including a birdcage coil, a spine coil, and at least one neck coil; said MR system having a predetermined number of receivers; said method comprising the steps of:
   (a) providing a plurality of input ports for coupling to said coils of said neurovascular coil system;
   (b) providing a plurality of output ports for coupling to said predetermined number of receivers of said MR system; and
   (c) selectively interconnecting said input ports and said output ports and thereby enable said neurovascular coil system to be selectively operated in (I) a neurovascular mode; (II) a high resolution brain mode; (III) a high speed brain mode; and (IV) a volume neck mode.

15. The method of claim 14 wherein said plurality of input ports includes:
   (a) a first input port for receiving an in-phase signal from said birdcage coil;
   (b) a second input port for receiving a quadrature signal from said birdcage coil;
   (c) a third input port for receiving a spine signal from said spine coil;
   (d) a fourth input port for receiving a first neck signal from a first of said at least one neck coil; and
   (e) a fifth input port for receiving a second neck signal from a second of said at least one neck coil; wherein in said neurovascular mode said interface circuit interconnects (i) said first and said second input ports to a first of said output ports; (ii) said third input port to a second of said output ports; (iii) said fourth input port to a third of said output ports; and (iv) said fifth input port to a fourth of said output ports.

16. The method of claim 15 wherein said in-phase and said quadrature signals received by said first and said second input ports, respectively, are phase shifted relative to one another before being combined and applied to said first output port.

17. The method of claim 14 wherein said plurality of input ports includes:
   (a) a first input port for receiving an in-phase signal from said birdcage coil; and
   (b) a second input port for receiving a quadrature signal from said birdcage coil;
   wherein in said high resolution brain mode said interface circuit interconnects (i) said first input port to one of said output ports and (ii) said second input port to an other of said output ports, thereby allowing said in-phase signal to be applied to said one output port and said quadrature signal to be applied to said other output port.

18. The method of claim 14 wherein said plurality of input ports includes:
   (a) a first input port for receiving an in-phase signal from said birdcage coil; and
   (b) a second input port for receiving a quadrature signal from said birdcage coil;
   wherein in said high speed brain mode said interface circuit interconnects said first and said second input ports to a first of said output ports with said in-phase and said quadrature signals received by said first and said second input ports, respectively, being phase shifted relative to one another before being combined and applied to said first output port.

19. The method of claim 14 wherein said plurality of input ports includes:
   (a) a first input port for receiving a spine signal from said spine coil;
   (b) a second input port for receiving a first neck signal from said at least one neck coil; and
   (c) a third input port for receiving a second neck signal from said at least one neck coil;
   wherein in said volume neck mode said interface circuit interconnects (i) said first input port to a first of said output ports thereby allowing said spine signal to be applied to said first output port, (ii) said second input port to a second of said output ports thereby allowing said first neck signal to be applied to said second output port, and (iii) said third input port to a third of said output ports thereby allowing said second neck signal to be applied to said third output port.

20. The method of claim 14 wherein said plurality of input ports includes:
   (a) a first input port for receiving a spine signal from said spine coil; and
   (b) a second input port for receiving a neck signal from said at least one neck coil;
   wherein in said volume neck mode said interface circuit interconnects (i) said first input port to a first of said output ports thereby allowing said spine signal to be applied to said first output port, and (ii) said second input port to a second of said output ports thereby allowing said neck signal to be applied to said second output port.

21. The method of claim 14 wherein said plurality of input ports includes:
   (a) a first input port for receiving an in-phase signal from said birdcage coil; and
   (b) a second input port for receiving a quadrature signal from said birdcage coil;
   wherein said interface circuit is switchable between interconnecting (i) said first and said second input ports to one of said output ports with said in-phase and said quadrature signals being phase shifted relative to one another, combined and applied to said one of said output ports; and (ii) said first and said second input ports, and applying said in-phase and said quadrature signals received respectively thereby, to a first and a second of said output ports, respectively.

22. The method of claim 14 further comprising the step of effectively disabling said coils that are unused in accordance with a particular one of said modes of operation currently selected.

23. The method of claim 14 wherein the step of selectively interconnecting said input ports and said output ports is accomplished by changing a state of at least one PIN diode so as to switch said neurovascular coil system between said modes of operation.

24. The method of claim 23 wherein said MR system determines which of said modes of operation of said neurovascular coil system to support by detecting via said receivers of said MR system a bias pattern of said at least one PIN diode.

25. The method of claim 14 wherein the step of selectively interconnecting said input ports and said output ports is carried out by using at least one combiner circuit for remotely switching said neurovascular coil system between said modes of operation, said combiner circuit comprising at least one remotely operable PIN diode and a 90 degree phase shifting circuit.

26. The method of claim 14 wherein a conductive path between any one of said input ports and any one of said output ports has an electrical length that is approximately equal to an integer multiple of half wavelengths.

27. A neurovascular coil system for coupling to a magnetic resonance (MR) system, said MR system being equipped with a predetermined number of receivers, said neurovascular coil system comprising:
   (a) an array of coils including a birdcage coil, at least one spine coil, and at least one neck coil,
   (b) a plurality of input ports with said birdcage coil connected to at least one of said input ports, said at least one spine coil connected to one of said input ports, and said at least one neck coil connected to at least one of said input ports;
   (c) a plurality of output ports for coupling to said predetermined number of receivers of said MR system; and
   (d) an interface circuit for enabling said input ports and said output ports to be selectively interconnected and thereby enable said neurovascular coil system to be selectively operated in (I) a neurovascular mode; (II) a high resolution brain mode; (III) a high speed brain mode; and (IV) a volume neck mode.

28. The neurovascular coil system of claim 27 wherein in said neurovascular mode:
   (a) said birdcage coil by a first and a second of said input ports is interconnected to a first of said output ports, thereby enabling an in-phase signal and a quadrature signal from said birdcage coil to be applied through said first output port to a first of said receivers of said MR system;
   (b) said at least one spine coil by a third said input ports is interconnected to a second of said output ports, thereby enabling a spine signal from said at least one spine coil to be applied through said second output port to a second of said receivers of said MR system; and
   (c) said at least one neck coil by a fourth and a fifth of said input ports is interconnected to a third and a fourth, respectively, of said output ports, thereby enabling a first neck signal from a first of said at least one neck coil and a second neck signal from a second of said at least one neck coil to be applied through said third and said fourth output ports, respectively, to a third and a fourth of said receivers, respectively, of said MR system.

29. The neurovascular coil system of claim 28 wherein said in-phase and said quadrature signals of said birdcage coil received by said first and said second input ports, respectively, are within said interface circuit phase shifted relative to one another before being combined and applied to said first output port.

30. The neurovascular coil system of claim 27 wherein in said high resolution brain mode said birdcage coil by a first and a second of said input ports is interconnected to a first and a second, respectively, of said output ports, thereby enabling an in-phase signal and a quadrature signal from said birdcage coil to be applied through said first and said second output ports to a first and a second, respectively, of said receivers of said MR system.

31. The neurovascular coil system of claim 27 wherein in said high speed brain mode said birdcage coil by a first and a second of said input ports is interconnected to a first of said output ports, with an in-phase signal and a quadrature signal of said birdcage coil received by said first and said second input ports, respectively, being phase shifted relative to one another before being combined and applied to said first output port by said interface circuit.

32. The neurovascular coil system of claim 27 wherein in said volume neck mode:
   (a) said at least one spine coil by a first of said input ports is interconnected to a first of said output ports, thereby enabling a spine signal from said at least one spine coil to be applied through said first output port to a first of said receivers of said MR system; and
   (b) said at least one neck coil by a second and a third of said input ports is interconnected to a second and a third, respectively, of said output ports, thereby enabling a first neck signal from a first of said at least one neck coil and a second neck signal from a second of said at least one neck coil to be applied through said second and said third output ports, respectively, to a second and a third of said receivers, respectively, of said MR system.

33. The neurovascular coil system of claim 28 wherein in said volume neck mode:
   (a) said at least one spine coil by a first of said input ports is interconnected to a first of said output ports, thereby enabling a spine signal from said at least one spine coil to be applied through said first output port to a first of said receivers of said MR system; and
   (b) said at least one neck coil by a second of said input ports is interconnected to a second of said output ports, thereby allowing a neck signal from said at least one neck coil to be applied to said second output port.

34. A magnetic resonance (MR) system comprising:
   (a) a predetermined number of receivers; and
   (b) a neurovascular coil system operably connectable to said MR system, said neurovascular coil system including:
      (i) an array of coils including a birdcage coil, at least one spine coil, and at least one neck coil;
      (ii) a plurality of input ports with said birdcage coil connected to at least one of said input ports, said at least one spine coil connected to one of said input ports, and said at least one neck coil connected to at least one of said input ports;
      (iii) a plurality of output ports for coupling to said predetermined number receivers; and
      (iv) an interface circuit for enabling said input ports and said output ports to be selectively interconnected;
   thereby enabling said neurovascular coil system to be selectively operated via said MR system in (A) a neurovascular mode; (B) a high resolution brain mode; (C) a high speed brain mode; and (D) a volume neck mode.

* * * * *